United States Patent
Bhusanur et al.

(10) Patent No.: US 11,598,809 B2
(45) Date of Patent: Mar. 7, 2023

(54) AUTOMATED DIGITIZED SYSTEM AND METHODS FOR VERIFYING POWER RELAY DISCONNECT

(71) Applicant: Sonnen, Inc., Tucker, GA (US)

(72) Inventors: Chetan Bhusanur, Atlanta, GA (US); Andres Salazar-Llinas, Decatur, GA (US); Carlos Restrepo, Atlanta, GA (US)

(73) Assignee: Sonnen, Inc., Stone Mountain, GA (US)

( * ) Notice: Subject to any disclaimer, the term of this patent is extended or adjusted under 35 U.S.C. 154(b) by 72 days.

(21) Appl. No.: 16/853,982

(22) Filed: Apr. 21, 2020

(65) Prior Publication Data

US 2020/0379047 A1 Dec. 3, 2020

Related U.S. Application Data

(60) Provisional application No. 62/855,399, filed on May 31, 2019.

(51) Int. Cl.
*G01R 31/327* (2006.01)
(52) U.S. Cl.
CPC .................. *G01R 31/3275* (2013.01)
(58) Field of Classification Search
None
See application file for complete search history.

(56) References Cited

U.S. PATENT DOCUMENTS

| | | | | |
|---|---|---|---|---|
| 3,576,482 A | * | 4/1971 | Rhee | G08C 23/02 318/16 |
| 4,168,463 A | * | 9/1979 | Slamecka | G01R 31/3336 324/424 |
| 5,579,197 A | * | 11/1996 | Mengelt | H02J 9/062 361/93.4 |
| 9,397,580 B1 | * | 7/2016 | Alexander | H02M 1/15 |
| 2005/0141154 A1 | * | 6/2005 | Consadori | H02J 3/007 361/62 |
| 2006/0212745 A1 | | 9/2006 | Zansky et al. | |
| 2007/0159740 A1 | * | 7/2007 | Williams | H02H 3/33 361/42 |
| 2010/0226160 A1 | | 9/2010 | Prior et al. | |
| 2014/0084687 A1 | * | 3/2014 | Dent | H02J 7/0068 307/26 |
| 2014/0226365 A1 | | 8/2014 | Oberzaucher et al. | |
| 2018/0026550 A1 | | 1/2018 | Dent | |

* cited by examiner

*Primary Examiner* — Nasima Monsur
(74) *Attorney, Agent, or Firm* — Clive McClintock

(57) ABSTRACT

Systems and methods for automatically verifying that power relays have been disconnected include relays arranged between two power sources. Test nodes are positioned between the relays on each line, and feed into a detection circuit. Voltage drop resistors, voltage drop diodes, an optocoupler, and additional resistors and capacitors are used to provide voltage isolation for the detection circuit. Relays are methodically opened and closed to check the individual functioning of each relay, and a digital signal generated from the detection circuit. The design of the system with detection circuit isolation provides a safer and lower cost system for verifying that relays are operating correctly, with less costly components than traditional systems.

2 Claims, 9 Drawing Sheets

2 Phase Circuit

2 Phase Circuit

3 Phase Circuit

Table 1: Test Conditions For Relays Of Single-Phase and Bi-Phase Applications

| Step | Case # | Voltage Source | Relay Under Test | 105 | 106 | 107 | 108 | Output Signal at 125 | Conclusion |
|---|---|---|---|---|---|---|---|---|---|
| 1 | 1 | 100, 101 | 105, 107 | on (closed) | off (open) | on (closed) | off (open) | 0 | test circuit functioning |
|   | 2 | 100, 101 | 106, 108 | off (open) | on (closed) | off (open) | on (closed) | 0 | test circuit functioning |
| 2 | 3 | 101 | 105 | off (open) | off (open) | on (closed) | off (open) | 1 | 105 open |
|   | 4 | 100 | 106 | off (open) | off (open) | off (open) | on (closed) | 1 | 106 open |
|   | 5 | 100, 101 | 105, 106 | off (open) | off (open) | on (closed) | on (closed) | 1 | 105, 106 open |
| 3 | 6 | 101 | 107 | on (closed) | off (open) | off (open) | off (open) | 1 | 107 open |
|   | 7 | 100 | 108 | off (open) | on (closed) | off (open) | off (open) | 1 | 108 open |
|   | 8 | 100, 101 | 107, 108 | on (closed) | on (closed) | off (open) | off (open) | 1 | 107, 108 open |

FIG 5

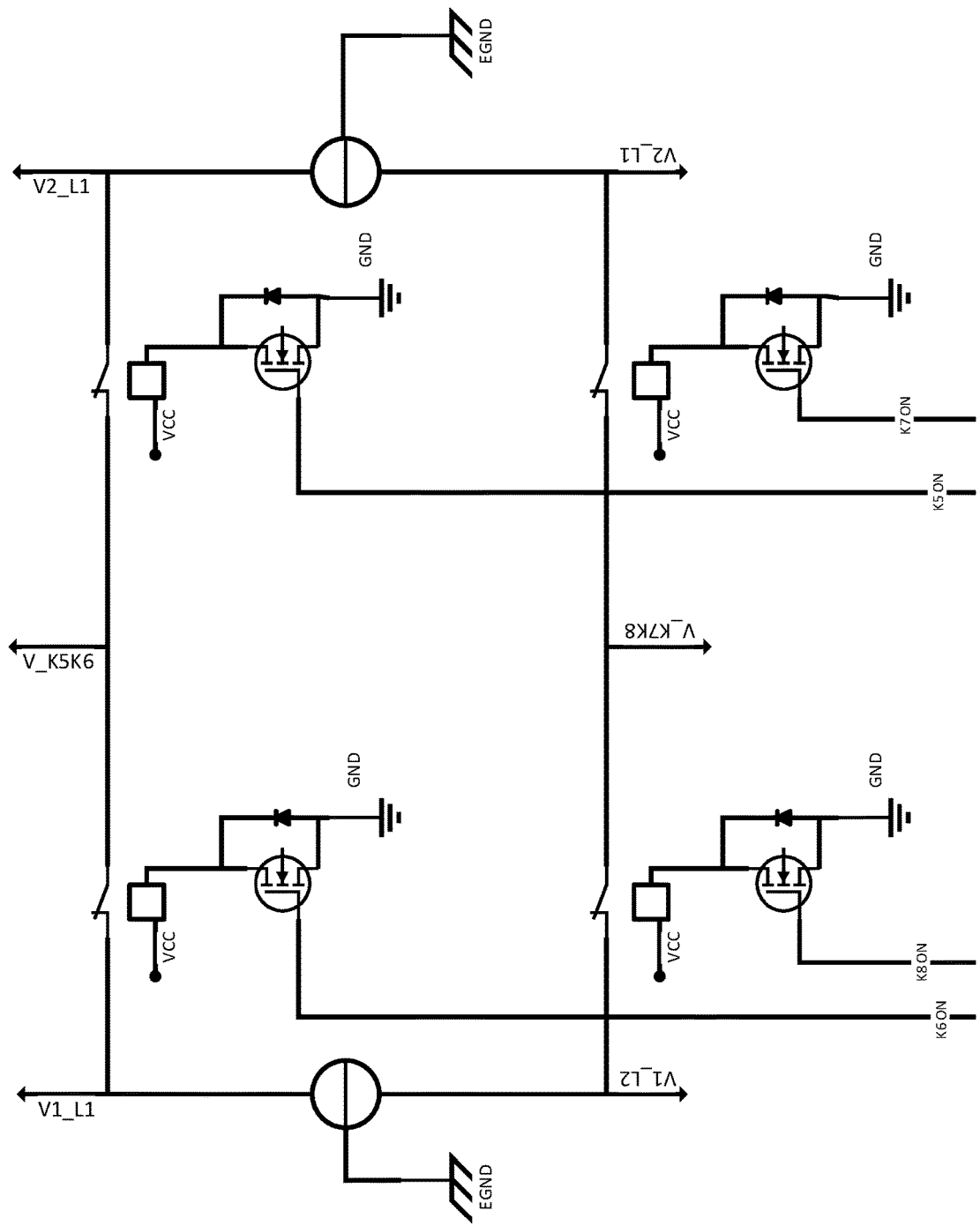
FIG 6: PRIOR ART
2 Phase Circuit-Traditional way

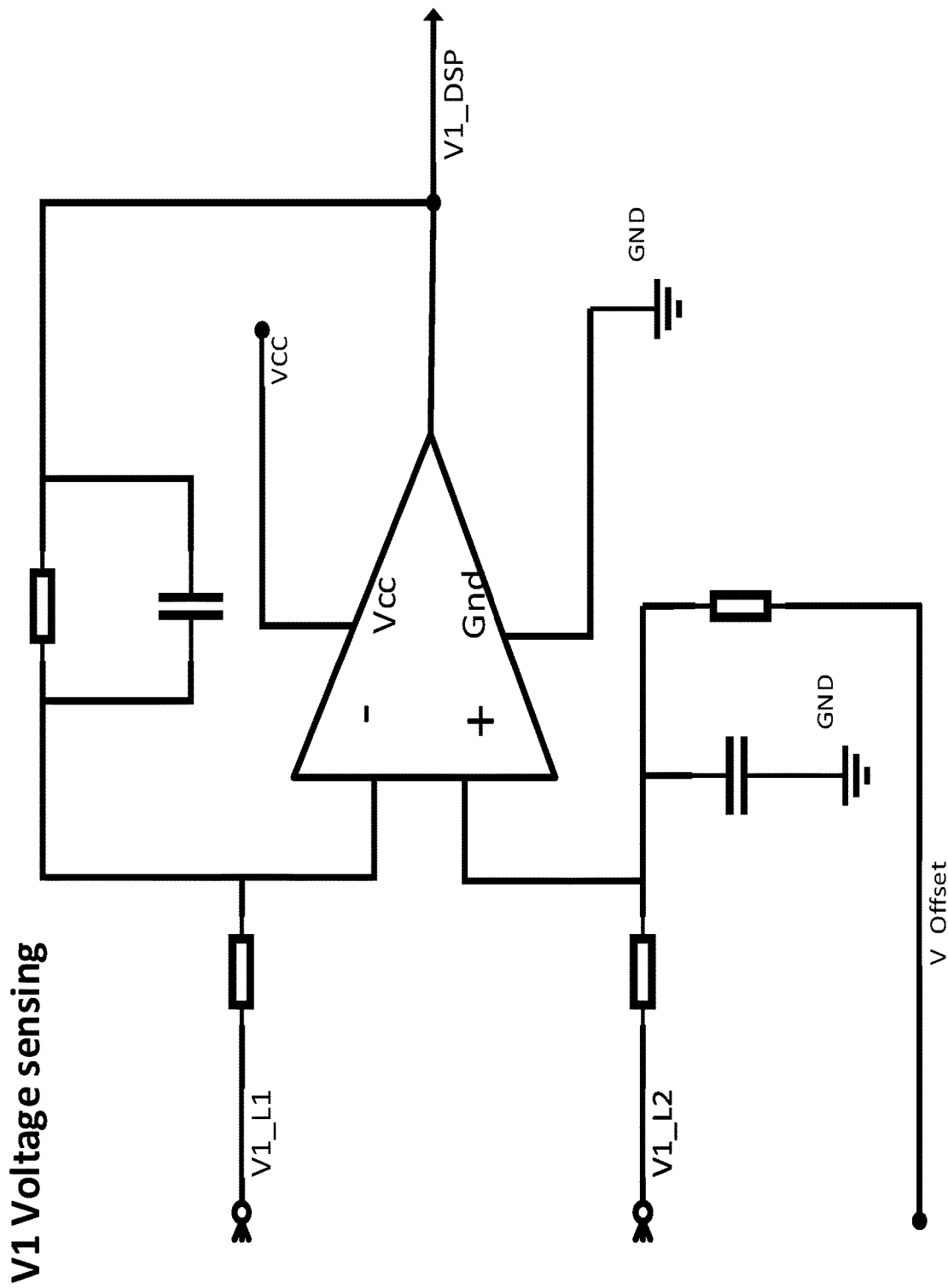
FIG 7: PRIOR ART

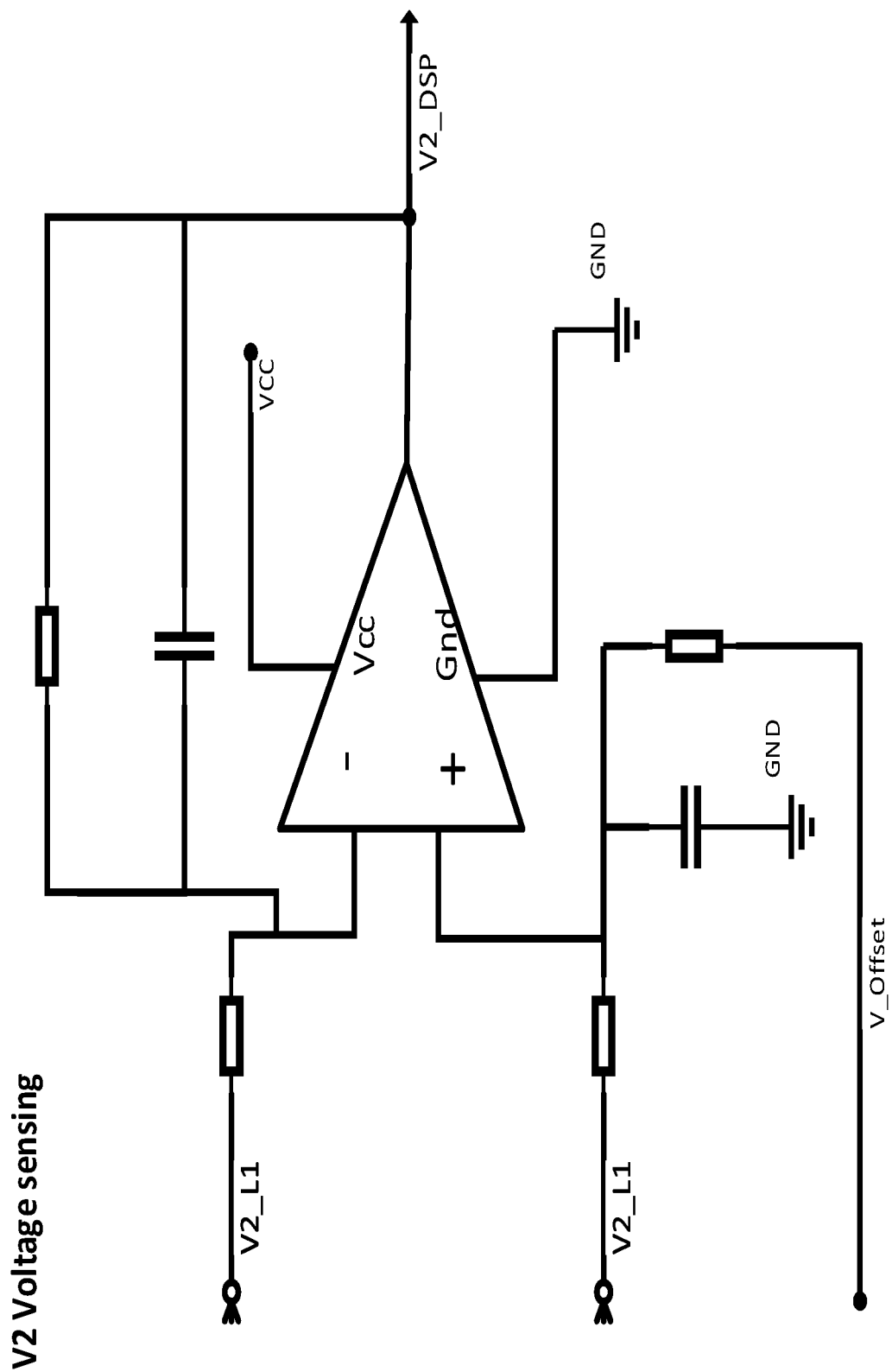
FIG 8: PRIOR ART

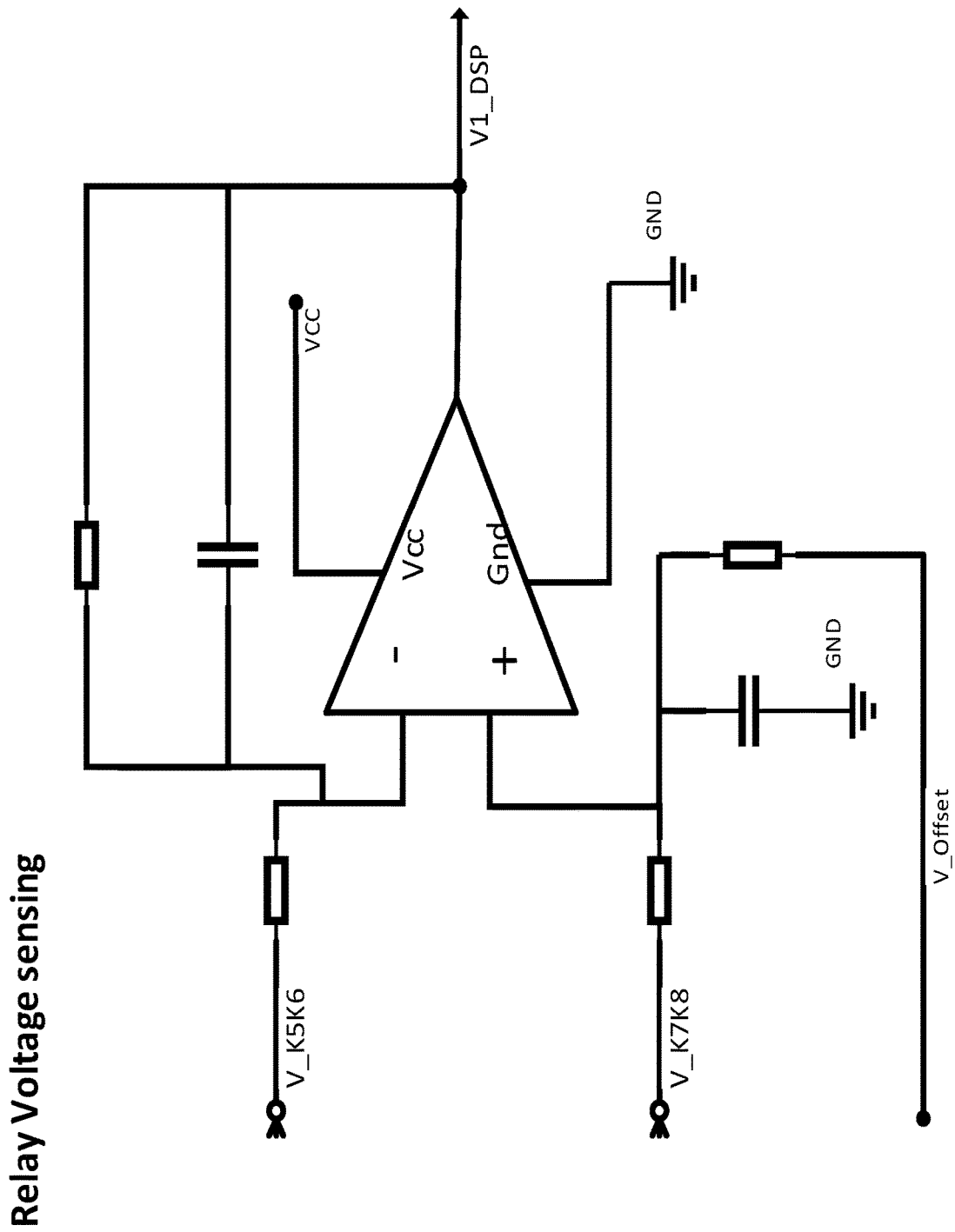
FIG 9: PRIOR ART

AUTOMATED DIGITIZED SYSTEM AND METHODS FOR VERIFYING POWER RELAY DISCONNECT

TECHNICAL FIELD

The present disclosure relates to the field of power source technologies, and specifically, relates to a circuit and methods for automatically verifying that power relays have been appropriately disconnected.

BACKGROUND OF THE INVENTION

Renewable energy, in particular photovoltaic (PV) solar energy, has become globally widespread. PV energy systems are frequently connected to an energy storage system (ESS), typically a direct current (DC) battery and inverter, to allow for storage and controlled distribution of energy. The ESS is commonly connected to a nearby alternating current (AC) utility grid and/or a local AC energy load. The ESS is capable of operating in at least two modes, including grid-connected (grid-tied) or islanded mode (also named back-up mode or off-grid mode). In addition to or in place of PV solar energy systems, the ESS may be connected to other renewable energy sources such as wind power or hydroelectric power, or other inverters or standard fuel-power generators.

A power inverter is an electronic device that changes DC to AC, and vice-versa. An inverter is required to effectively use battery power from an ESS in many common applications, because batteries operate on DC and both the utility grid and common electronics operate on AC. The input voltage, output voltage, frequency, and overall power handling depend on the design of the inverter.

Traditional power inverters utilize transformers and are isolated. More recently, non-isolated inverters that do not utilize transformers are being used. In order to achieve isolation for these newer inverters, disconnect relays and other methods are used.

Safety is a primary concern when dealing with high voltage systems and high capacity energy storage systems. If, for example, there is a power outage caused by a downed transmission line, it is critical that energy storage systems be properly disconnected and go off-grid. If the system is not properly disconnected, electricity may flow back through the transmission lines and cause a safety concern for the line workers.

The proper functioning of the disconnect means is important to maintain. In high-voltage systems, disconnect relays may inadvertently become stuck or welded together. In such cases, an ESS may not properly go off-line in the event of a power outage and may create a safety concern. Therefore, it is important to test the proper functioning of disconnect means.

In order to ensure safety in traditional systems, analog sensing is used to ensure that the disconnect means are functioning properly. The lines are simply tested to determine if there is current running through them. However, there are several disadvantages of analog sensing systems used to ensure relays are disconnected properly, including but not limited to the fact that they are usually not isolated from the high-voltage lines, an additional voltage reference is needed to offset the negative voltage reading when used with an AC source, an additional isolated power supply is required to use isolated analog sensing, and additional parts make the analog sensing system more expensive and complex. The fact that most commonly used analog sensing systems are not isolated presents safety concerns in and of itself, as high-voltage current may be running through easily-accessible areas of the inverter or other equipment.

Therefore, in order to ensure safety and prevent unintentional contact (shorts), it is desirable to have an isolated, automatic means of verifying that the power relays are disconnected. The digital detection circuit and methods herein provide a system that is effectively isolated, trustworthy, less parts-intensive, and more cost effective that prior systems and methods. Since the signals are digital here, one can use these signals to perform additional logic as required without needing a microprocessor or controller. The present invention therefore enjoys the benefits of being safer and less expensive than conventional systems for verifying disconnect of power relays.

BRIEF SUMMARY OF THE INVENTION

It is an object of the present invention to provide an automated, digitized system and methods to test and ensure the proper functioning of disconnect means, including but not limited to relays. It is a further object of the present invention to provide a system and methods to test disconnect means that is both safer and more cost-effective than existing systems and methods.

In one embodiment of the present invention, a detection circuit is provided for a single-phase or bi-phase power system. A disconnect circuit is provided between two active voltage sources. The two voltage sources are connected by two legs, with each leg containing two relays in series as required by safety compliance. A detection circuit is connected between the two relays on each leg. The detection circuit may be composed of voltage drop resistors, voltage drop diodes, an optocoupler, and other pull-down and pull-up resistors and filter capacitors, as will be understood by one of ordinary skill in the art. The relays may be controlled by a microprocessor or similar device, and may be achieved by manual switch and analog and/or digital signals. The detection circuit will be activated when the relays are configured to allow current to flow through the detection circuit. Utilizing the methods described herein, each relay can be individually tested to ensure proper functioning of the disconnect circuit.

In another embodiment, a detection circuit is provided for a three-phase or multi-system. Three or more legs, as needed, are provided with two relays each in series. A detection circuit is provided between the relays of each leg, as above. Utilizing the methods described herein, each relay can be individually tested to ensure proper functioning of the disconnect circuit.

The present invention may be used in electronic equipment including but not limited to inverters and converters, and in connection with applications including but not limited to battery chargers, capacitor banks for connecting active power sources, PV inverters and motor drives, as understood by one of ordinary skill in the art. The present invention may be adapted to single-phase applications or multi-phase applications, including but not limited to three-phase applications. By utilizing the teachings of the present invention, a safe and effective test of the disconnect means can be achieved at relatively low cost and with minimal parts.

BRIEF DESCRIPTION OF THE DRAWINGS

FIG. 5 is a Table showing various test conditions for the relays of a single-phase and bi-phase application of the present invention.

FIG. 6 is a schematic showing the lines and relays of a typical prior art system.

FIG. 7 is a schematic showing the voltage sensing apparatus on a first power source side of a typical prior art system.

FIG. 8 is a schematic showing the voltage sensing apparatus on a second power source side of a typical prior art system.

FIG. 9 is a schematic showing the voltage sensing apparatus between the relays of a typical prior art system.

DETAILED DESCRITION OF THE INVENTION

The invention relates generally to an energy storage system utilizing a non-isolated inverter. In order to ensure safety and prevent unintentional contacts (shorts), it is essential to confirm proper functioning and disconnection of power relays. A low-cost isolated digital system is provided for automatically verifying that power relays have been disconnected.

Figure 1:
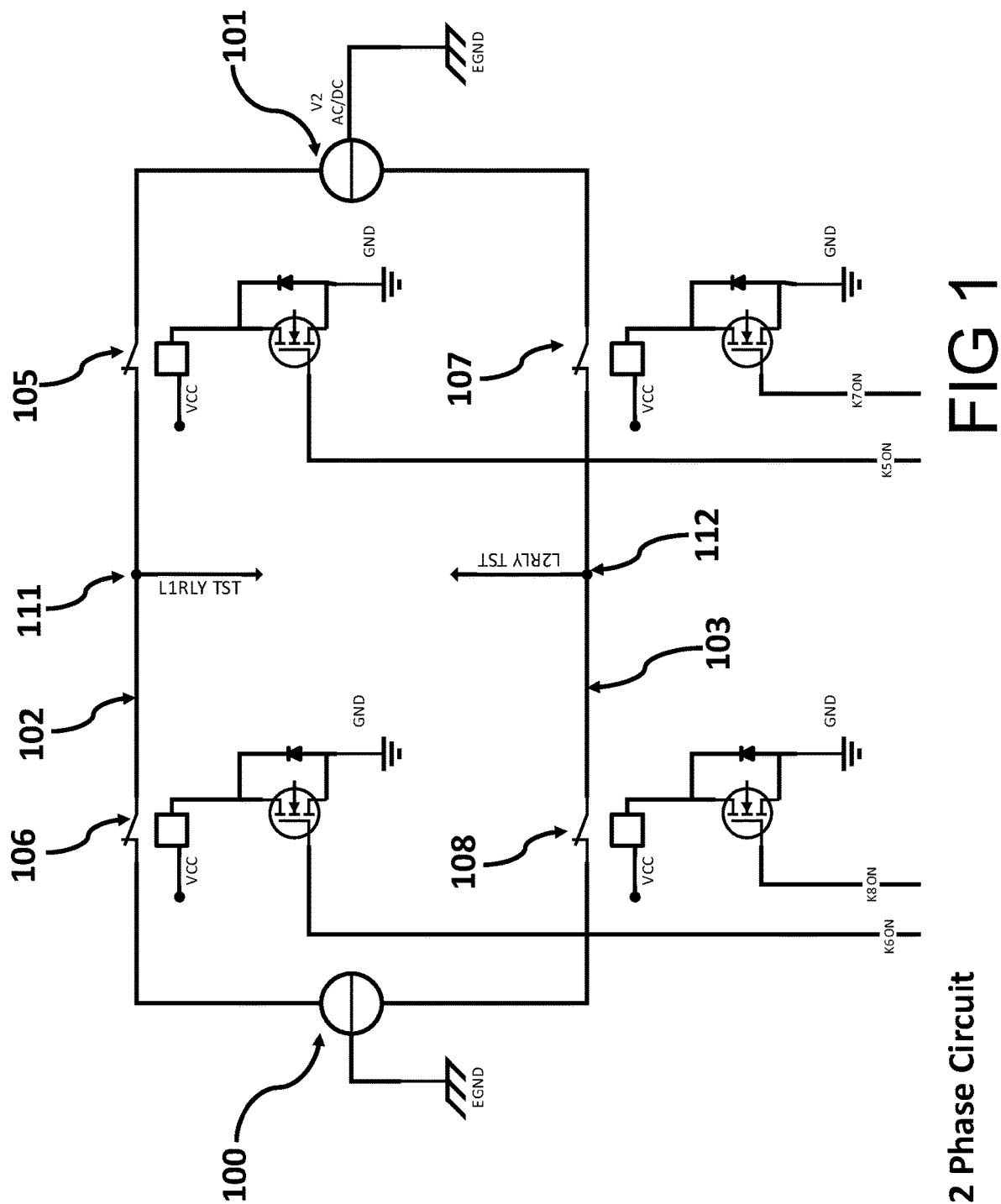
FIG. 1 is a schematic showing the lines and relays of a single-phase and bi-phase application of the present invention.

FIG. 1 depicts the line and relay configuration of one embodiment of the present invention. A first voltage source 100 and a second voltage source 101 are provided, and are connected by a first line 102 and a second line 103. One of ordinary skill in the art will understand that the first and second voltage sources could be any AC or DC power source, including but not limited to a power inverter or the electrical utility grid.

Relays 105, 106, 107, and 108 are positioned on the lines as shown in FIG. 1. In between relays 105 and 106 is a line-one relay test node 111, which connects into the test circuit depicted in FIG. 2. In between relays 107 and 108 is a line-two relay test node 112, which also connects into the test circuit depicted in FIG. 2.

The relays are generally composed of contact terminals and coils, although other configurations known to one of ordinary skill in the art may be used. The relay contact is connected in series with the line of the voltage sources, and a coil is used to drive the relay contact. Each relay is driven by a driver, which could be transistor. One end of the coil is connected to a low voltage source, for example voltage source 121. The transistor connects the other end of the relay coil to the ground (for example, ground 122) when activated. By using an appropriate transistor, the transistor can be used to connect the (+)ve or (—)ve end of low voltage source to a relay terminal. A diode is used to suppress reverse potential generated on the relay coil and protect the transistor when the relay is turned from an on (closed) state to an off (open) state. Turning the relay from an off to on state may be achieved by means of a microprocessor or similar device, as well as by manual switch or analog and digital signals.

Figure 2:
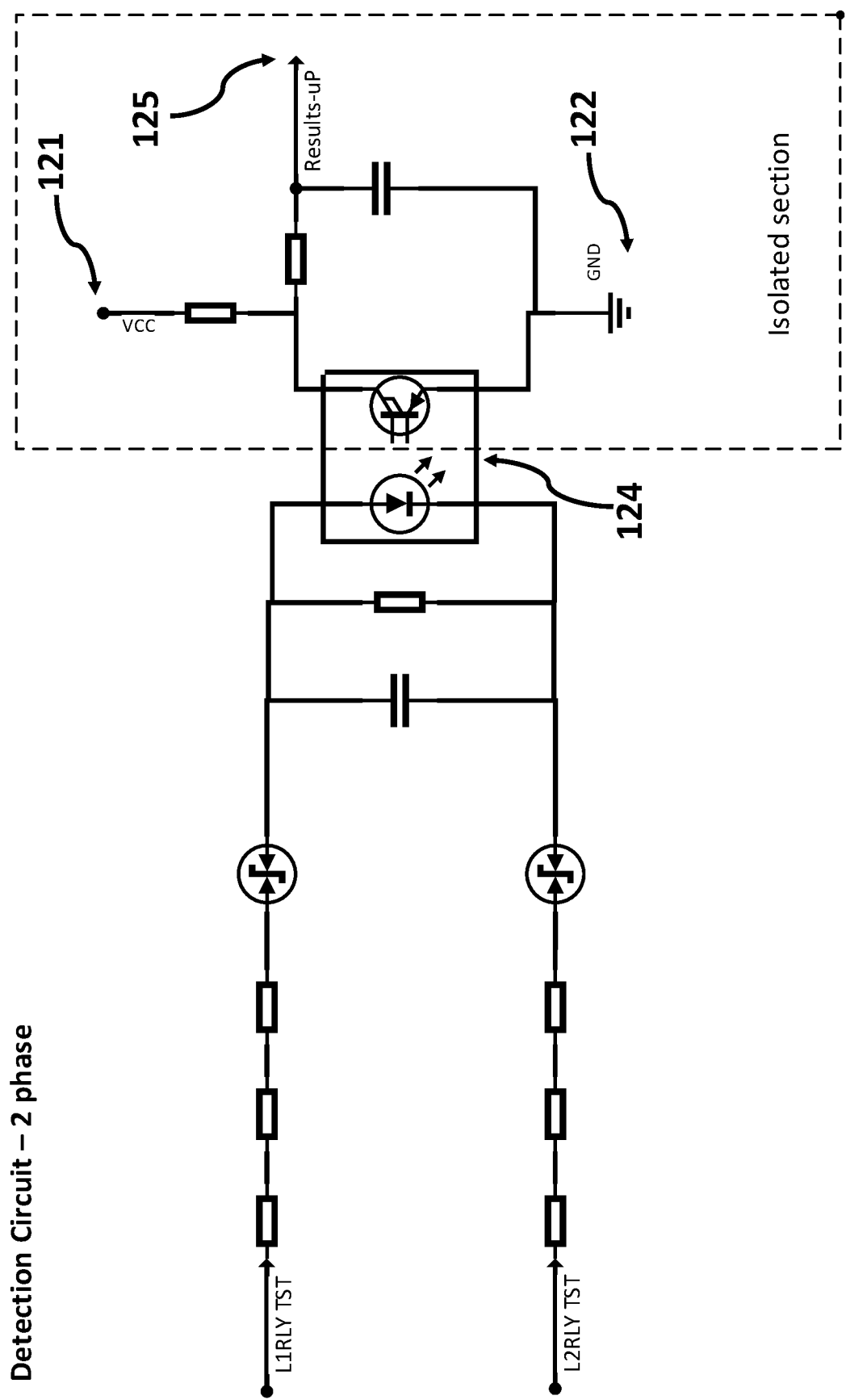
FIG. 2 is a schematic showing the detection circuit of a single-phase and bi-phase application of the present invention.

A detection circuit of one embodiment of the present invention is shown in FIG. 2. The detection circuit is composed mainly of voltage drop resistors, voltage drop diodes, an optocoupler and other pull-down and pull-up resistors along with filter capacitors. This results in voltage isolation of the detection circuit. However, other configurations may be used as understood by one of ordinary skill in the art. If isolation is not desired, then the detection circuit can be replaced with voltage level converting circuits like resistive divider networks.

The detection circuit in FIG. 2 is coupled to the relays by virtue of lines running from nodes 111 and 112 in FIG. 1. The output of the detection circuit is obtained from detector node 125, which is isolated as a result of the series of voltage drops between nodes 111 and 112 and optocoupler 124. Optocoupler 124 assists in making the test circuit determination. When current is flowing through both nodes 111 and 112 (from either or both of the voltage sources), there is a closed circuit running through optocoupler 124. This drives the optocoupler transistor and makes the impedance low at every peak of the AC cycle and high impedance for non-peak AC cycles, which makes the output signal from the detector voltage source 121 low for every peak of the AC cycle and high for non-peak AC cycles. This produces a corresponding output signal value of "0" for every peak AC cycle and "1" for non-peak AC cycles at the detector node 125, and demonstrates that the test circuit itself is working and that a pair of relays is able to close properly. If current is flowing through only node 111 or node 112, but not both, then there is not a closed circuit running through optocoupler 124. The impedance is therefore high, causing a high detector voltage to flow from source 121 through the detector node 125. In this circumstance, there is an output value of "1" from the detector node 125. This may be used to verify that a relay or group of relays is opened properly. One or both voltage sources may be engaged in any given test condition.

FIG. 5 presents Table 1, which shows the test conditions for the various relays 105, 106, 107, and 108 in the single-phase and bi-phase applications of FIG. 1. The first column shows that in this embodiment there are three general steps in a method for operating the test circuit. In the first step, two tests are performed. First, in Case 1, a signal is sent to turn off and open relays 106 and 108 and to turn on and close relays 105 and 107. This allows current to flow through relays 105 and 107 and, consequently, nodes 111 and 112. This activates the optocoupler 124, resulting in a "0" for every peak of the AC cycle and "1" for non-peak AC cycles at detector node 125. Second, in Case 2, the reverse is performed with 106 and 108 on and 105 and 107 off. These two tests tentatively verify that the detection circuit is working and that the relays are not stuck open.

In Step 2, three tests are performed to verify that relays 105 and 106 are opening properly and are not stuck closed. In Case 3, only voltage source 101 is used. Relay 107 is set to on, or closed, and relay 105 is set to off, or open. If relay 105 is opening (disconnecting) correctly, the test circuit receives current only from node 112, but not node 111. The optocoupler is therefore in an off position, allowing current to flow from source 121 to detector node 125, and resulting in an output signal of "1". This verifies that relay 105 is properly open. In Case 4, a similar test is performed on relay 106 using voltage source 100 and by turning relay 106 off and relay 108 on. Then, in Case 5, both relays 105 and 106 are tested simultaneously to verify that both are opening and disconnecting properly. Step 3, Cases 6-8, follow the same general pattern as step 2 and are used to test relays 107 and 108.

One of ordinary skill in the art will understand that the steps outlined above are a logical, systematic method of checking each of the disconnect relays in the embodiment shown in FIG. 1. However, there are a variety of permutations of cases that could be used to test the disconnect relays, and the order of testing can be rearranged. Therefore, Table 1 in FIG. 5 is provided as an example only, and is not intended to limit the invention.

Figure 3:
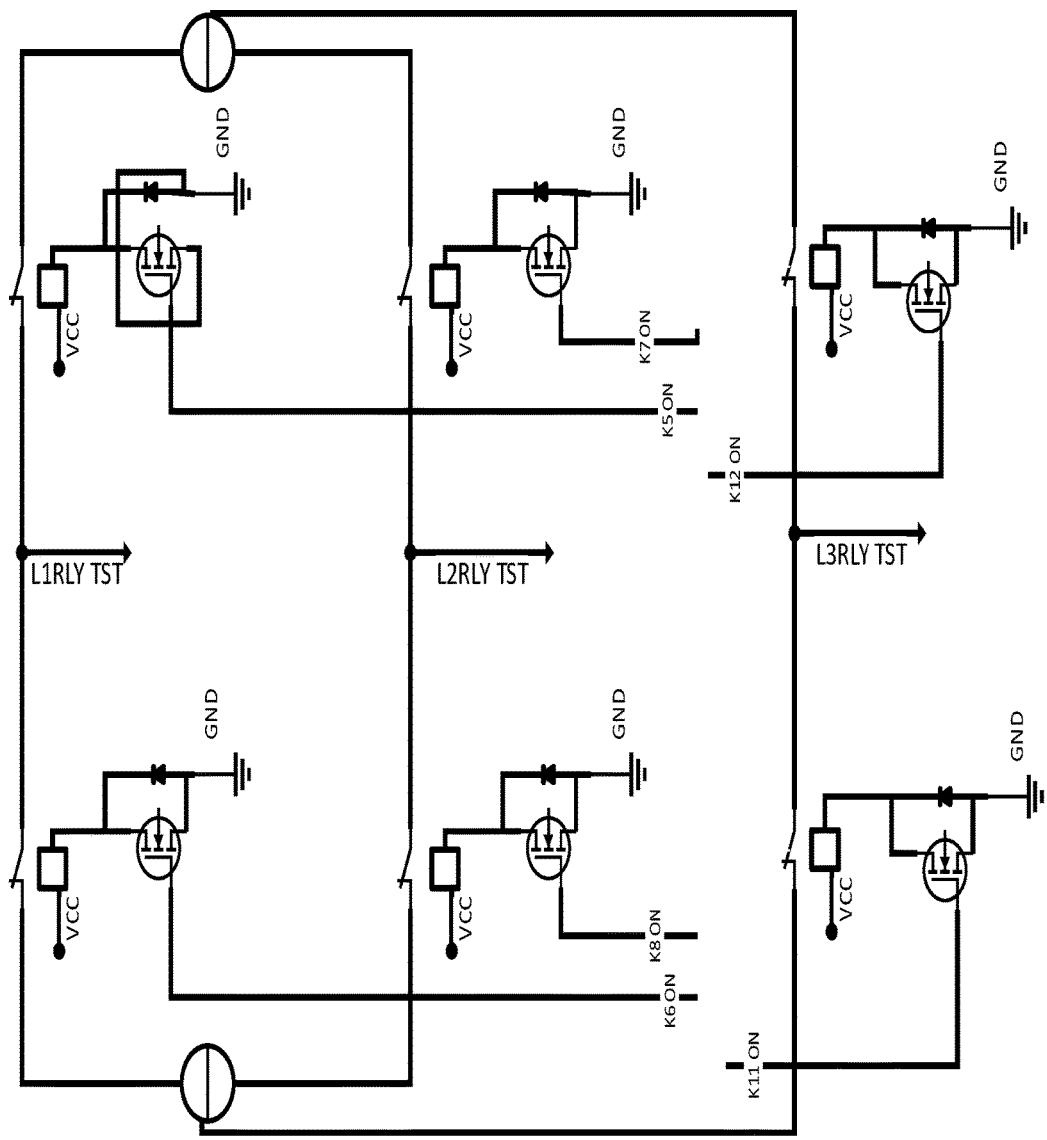
FIG. 3 is a schematic showing the lines and relays of a three-phase and multi-phase application of the present invention.
Figure 4:
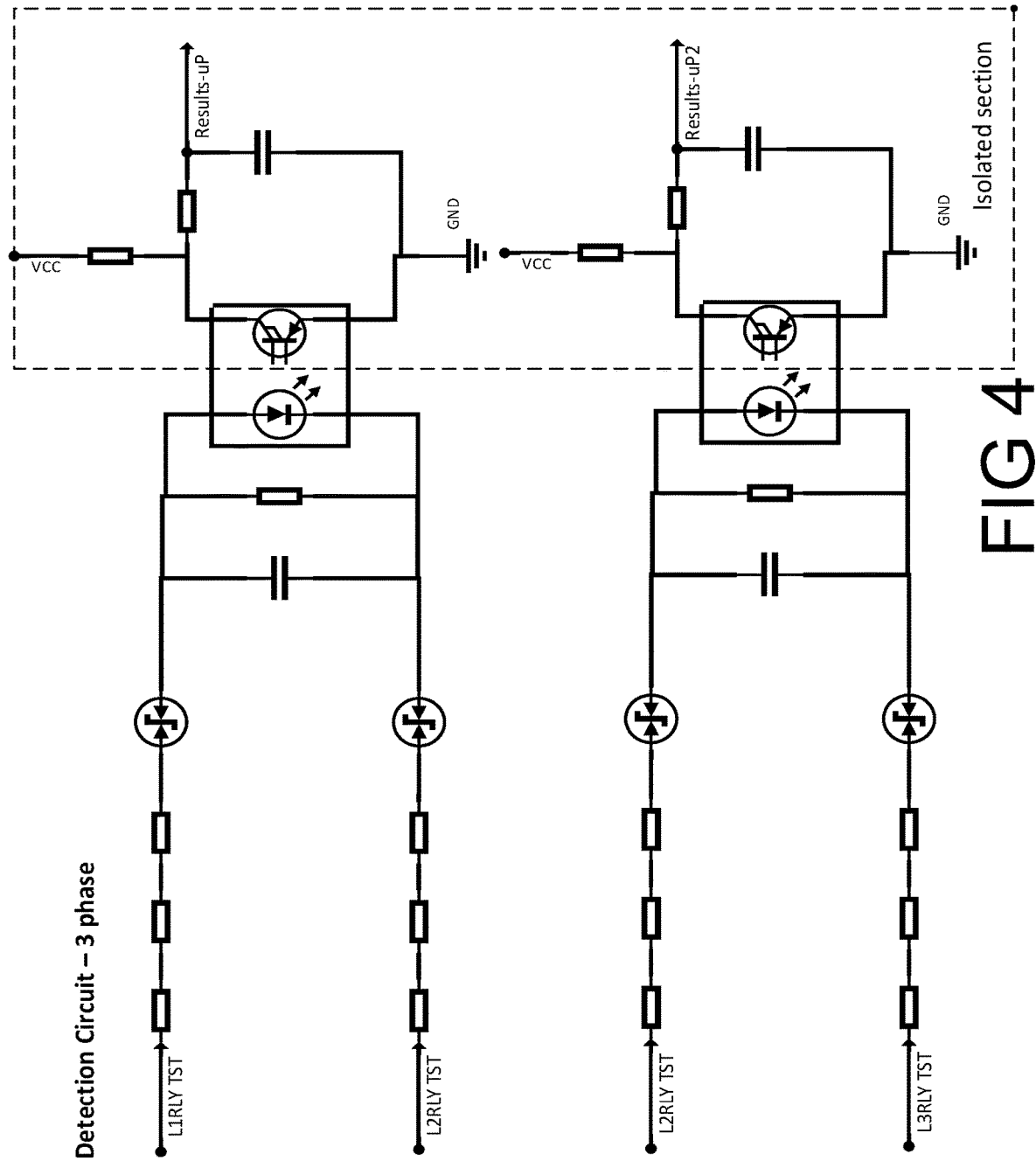
FIG. 4 is a schematic showing the detection circuit of a three-phase and multi-phase application of the present invention.

FIGS. 3 and 4 expand on the single-phase and bi-phase applications of FIGS. 1 and 2, and provide line and relay configurations and test circuits for three-phase and multi-phase applications in another embodiment of the present invention. From FIGS. 3 and 4, and utilizing the principles in Table 1 of FIG. 5 which gives step by step operations for the single-phase and bi-phase applications, one of ordinary skill in the art will understand how to operate the line relays and test circuit conditions in order to ensure functioning of the disconnect means in a three-phase or multi-phase application.

FIGS. 6-9 show prior art methods of disconnecting two voltage sources, and typical means of testing the disconnection. In FIG. 6, two active sources are provided as in FIG. 1. However, as can be seen by the design of the test circuits in FIGS. 7-9, six nodes are required in FIG. 6 to test the relays as opposed to just two in FIG. 1. The analog detection circuits presented in in this prior art example utilize Opamp sensing or similar analog sensing technology and resistors. Additional voltage references are required to offset the reading for negative voltage when AC sources are used. A DSP, microprocessor, or similar device is required to compute voltage levels and perform logical operation. Overall, this design uses more parts and is more expensive than the embodiments of the present invention. Moreover, the configuration and detection circuits shown in 6-9 are not isolated, and therefore present safety concerns when accessing the circuits.

One of ordinary skill in the art will understand how to implement the embodiments of the present inventions in these applications to achieve the benefits of a low cost digital system for automatically verifying that the power relays have been disconnected. The invention may be used in any electronics application where a relay, contactor, manual circuit breaker, manual switch or derivative such as a solid-state relay, power relay, electronic relay, or similar device is used as the disconnect means.

The above-described embodiments of the present invention are intended to be examples only. Alterations, modifications, and variations may be effected to the particular embodiments by those of skill in the art without departing from the scope of the invention, which is defined solely by the claims appended hereto.

What is claimed is:

1. A method for testing whether power relays are operable, comprising the steps of:
providing two lines arranged in parallel between two voltage sources to allow for bi-directional current flow between the two voltage sources;
providing two relays connected in series on each line;
providing a test line arranged between the two relays on each line;
providing a test circuit directly connected to the test lines;
closing each relay individually in series, while setting the remaining relays to remain open;
operating the voltage source nearest to the closed relay;
observing the output of the test circuit;
generating a report that indicates whether each relay is operable;
closing the relays that are nearest to a given voltage source, while setting the relays nearest the other voltage source to remain open; and
operating both voltage sources.

2. The method of claim 1, further comprising the steps of:
opening the relays on a single line, while setting the relays on the remaining lines to remain closed; and
operating both voltage sources.

* * * * *